(12) United States Patent
Butterfield, IV

(10) Patent No.: US 11,469,584 B1
(45) Date of Patent: Oct. 11, 2022

(54) METHOD AND APPARATUS FOR WIRE MANAGEMENT

(71) Applicant: Chevron U.S.A. Inc., San Ramon, CA (US)

(72) Inventor: Albert E. Butterfield, IV, Novato, CA (US)

(73) Assignee: CHEVRON U.S.A. INC., San Ramon, CA (US)

( * ) Notice: Subject to any disclaimer, the term of this patent is extended or adjusted under 35 U.S.C. 154(b) by 0 days.

(21) Appl. No.: 17/330,660

(22) Filed: May 26, 2021

(51) Int. Cl.
*H02G 15/00* (2006.01)
*H05K 7/02* (2006.01)
*H05K 7/12* (2006.01)

(52) U.S. Cl.
CPC ............... *H02G 15/00* (2013.01); *H05K 7/02* (2013.01); *H05K 7/12* (2013.01)

(58) Field of Classification Search
CPC ............ H02G 15/00; H02G 3/32; H05K 7/02; H05K 7/12; H05K 7/14; F16L 3/00; F16L 3/02; F16L 3/08; F16L 3/22
See application file for complete search history.

(56) References Cited

U.S. PATENT DOCUMENTS

| | | | | |
|---|---|---|---|---|
| 7,546,985 B1* | 6/2009 | Choi | ...................... | F16L 3/01 248/62 |
| 8,178,795 B2* | 5/2012 | Roy | ...................... | H02G 3/185 174/68.3 |
| 8,664,544 B2* | 3/2014 | Even | ...................... | F03D 80/85 174/72 A |
| 9,024,211 B2* | 5/2015 | Stathis | ................. | H02G 3/0406 174/152 G |
| 2018/0113268 A1* | 4/2018 | Van Baelen | ......... | G02B 6/4457 |

* cited by examiner

*Primary Examiner* — Anita M King
(74) *Attorney, Agent, or Firm* — King & Spalding LLP

(57) ABSTRACT

A portable wire management ring configured to secure wires. The wire management ring includes an outer housing that has an outer housing base in a ring shape, the outer housing including a wire clamping region that is disposed along a circumference of the outer housing, and an outer housing cover that is attached to the outer housing base. The wire management ring also includes an inner securing ring that is disposed within the outer housing base. The inner securing ring includes a plurality of notches that are configured to secure a plurality of wires passing through the wire management ring, respectively.

19 Claims, 5 Drawing Sheets

METHOD AND APPARATUS FOR WIRE MANAGEMENT

TECHNICAL FIELD

The present disclosure relates generally to a portable wire management ring that groups and secures wires.

BACKGROUND

Wires, including electrical cables, can easily become tangled and hard to identify or work with in installing and operating modern electrical systems. For example, in measuring air fan performance in oil refinery production facilities, it may be required to measure air flow and air temperature at various locations over the air fan, which requires utilization of multiple air fan measurement devices in an air fan measurement system to improve efficiency. Each of the multiple air fan measurement devices may include one or more electrical wires or power cables that are configured for data transmission and power supply purposes. When there are multiple air fan measurement devices, the large number of wires in the air fan measurement system can make it difficult to manage and identify the wires during the installation and operation of the system. In addition, depending on locations of the air fan measurement devices relative to the air fan, allowing the wires to become tangled or come into contact with the rotating air vanes can cause problems for the operator making the measurements.

Further, electrical devices having many wires, such as the described air fan measurement system, are often used in extreme or harsh conditions. The extreme or harsh conditions can exacerbate the challenges an operator may encounter when trying to manage multiple wires of an electrical device Therefore, wire management is a vital part of every electrical system's installation and operation. A system that helps securing and managing wires is desirable for improving installation efficiency, worker and system performance, and operation safety.

SUMMARY

The present disclosure relates generally to securing wires using a portable wire management ring. In an example embodiment, a portable wire management ring includes an outer housing, including an outer housing base in a ring shape. The outer housing base includes a wire clamping region that is disposed along a circumference of the outer housing. The outer housing also includes an outer housing cover that is attached to the outer housing base. Further, the portable wire management ring includes an inner securing ring that is disposed within the outer housing base, the inner securing ring including a plurality of notches that are configured to secure a plurality of wires passing through the wire management ring, respectively.

In another example embodiment, a method of operating wires includes rotating an inner securing ring of a wire management ring to fully expose one of a plurality of notches that are located on the inner securing ring. The method also includes inserting a wire into the one of the plurality of notches through an opening of a wire clamping region of the wire management ring. Further, the method includes rotating the inner securing ring to secure the wire within the wire clamping region. Lastly, the method includes fastening an adjustable handle through a first hole of the wire management ring, the adjustable handle being in contact with the inner securing ring, to lock the inner securing ring in the wire management ring.

These and other aspects, objects, features, and embodiments will be apparent from the following description and the appended claims.

BRIEF DESCRIPTION OF THE DRAWINGS

Reference will now be made to the accompanying drawings, which are not necessarily drawn to scale, and wherein.

Figure 1:
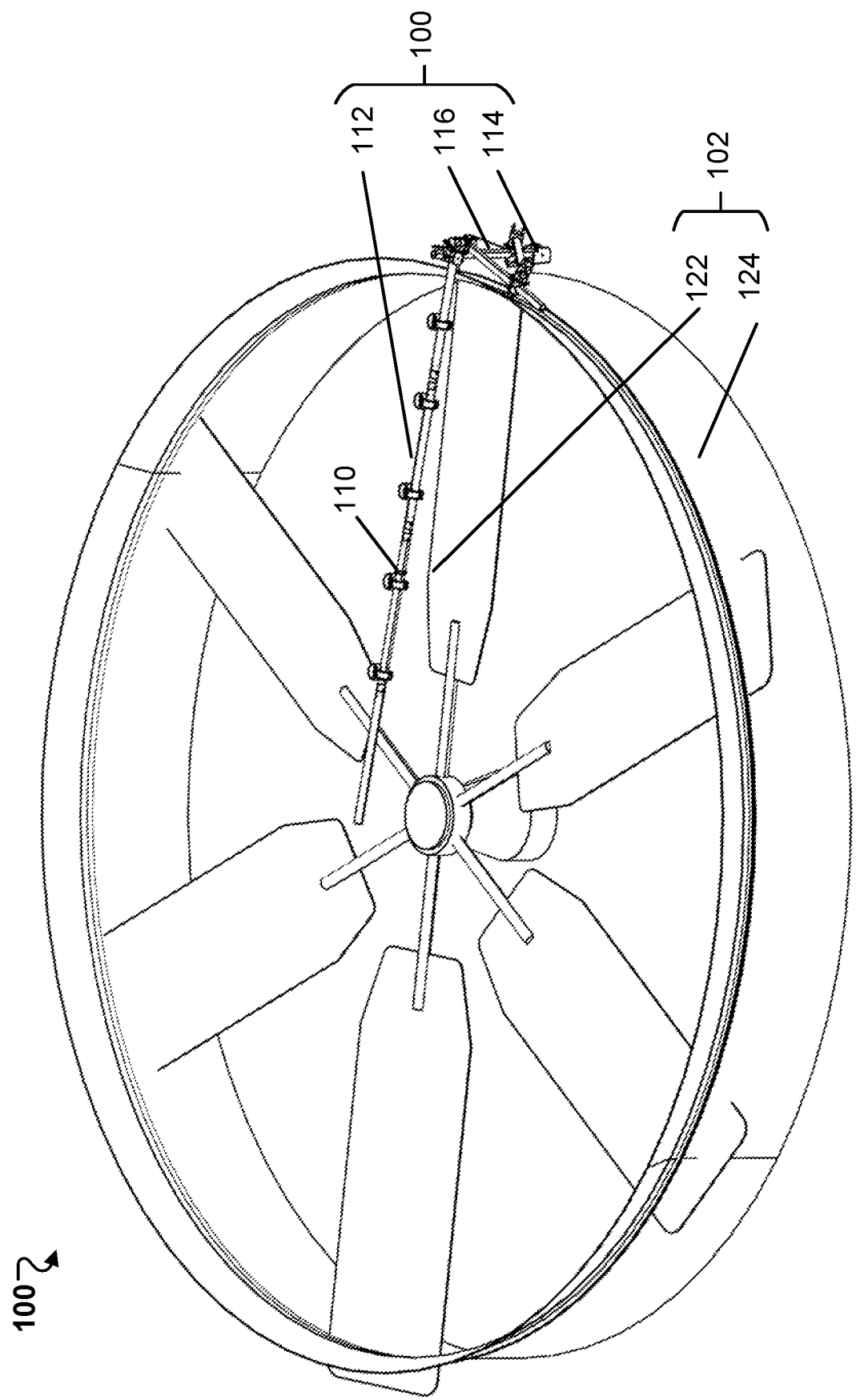
FIG. 1 illustrates an exemplary wire management ring disposed on an air fan measurement tool according to an example embodiment.

The drawings illustrate only example embodiments and are therefore not to be considered limiting in scope. The elements and features shown in the drawings are not necessarily to scale, emphasis instead being placed upon clearly illustrating the principles of the example embodiments. Additionally, certain dimensions or placements may be exaggerated to help visually convey such principles. In the drawings, the same reference numerals used in different embodiments designate like or corresponding, but not necessarily identical, elements.

DETAILED DESCRIPTION OF EXAMPLE EMBODIMENTS

In the following paragraphs, particular embodiments will be described in further detail by way of example with reference to the drawings. In the description, well-known components, methods, and/or processing techniques are omitted or briefly described. Furthermore, reference to various feature(s) of the embodiments is not to suggest that all embodiments must include the referenced feature(s).

Turning now to the drawings, FIG. 1 illustrates an exemplary wire management ring 110 disposed on an air fan measurement tool 100 according to an example embodiment. The wire management ring 110 is disposed on the air fan measurement tool 100 to assist with air fan performance measurements. Specifically, the air fan measurement tool 100 includes a plurality of air fan measurement devices, each one of the plurality of air fan measurement devices having an electrical wire configured for data transmission and power supply. The wire management ring 110 is configured to group and secure the electrical wires of the air fan measurement tool 100 during installation and operation of the air fan measurement tool 100 on the air fan 102.

In an example embodiment, the wire management ring 110 as well as the air fan measurement tool 100 are installed on an air fan 102 for air flow and air temperature measurements. The air fan performance measurements are required to be performed at multiple, e.g., 5 or more, locations per air fan quadrant, according to industry standards. For higher efficiency, the air fan measurement tool 100 comprises the plurality of air fan measurement devices to measure air fan performance at multiple locations at the same time.

In an example embodiment, the air fan 102 is an axial fan consists of a rotating arrangement of a plurality of vanes 122. The plurality of vanes 122 are disposed within the air fan guard 124 and rotated in an air fan plane. In this example, the plurality of vanes 122 are configured to rotate to act on the air, and then create a flow of air. In general, the air fan vanes 122 are angled, having one edge higher than the other edge. Further, the air fan guard 124 is configured to increase safety of operating the air fan 102 by preventing objects from contacting the air fan vanes 122. The air fan 102 may be powered by electric motors, hydraulic motors, or internal combustion engines. In addition, the air fan vanes 122 can be designed in various shapes to produce air flows with high volume and low pressure. In this example, the air fan 102 can be used for climate control, dust removal, and ventilation. Specifically, the air fan 102 can be configured to generate air flow along a vertical axis of the air fan 102 to extract hot air or increase heat convection into surrounding environment. The air fan 102 may be located on top of a machine and process for cooling. In another example embodiment, the air fan 102 may be installed below a machine or process for heat exchanging with surrounding air. The air vanes 122 may be made of wood, plastic, or metal materials. In this example, the air fan guard 124 may be made of metal materials including aluminum, iron, copper, or their alloys.

In an example embodiment, the portable air fan measurement tool 100 is configured to measure air velocity and air flow temperature above or below the air fan 102. Specifically, air fan measurement tool 100 contains the plurality of air fan measurement devices for the air flow and air temperature measurements. As shown in FIG. 1, the air fan measurement tool 100 consists of a boom 112 that hangs horizontally above the air fan 102 and the plurality of air fan measurement devices are attached thereon. The boom 112 may have a length similar to a radius of the air fan 102 and may extend from the air fan guard 124 to a center of the air fan 102. The plurality of air fan measurement devices may be equidistantly spaced from each other on the boom 112 and may measure the air flow and air temperature at various radial distances of the air fan 102. In this example, the wire management ring 110 is disposed on the boom 112 of the air fan measurement tool 100. Each of the plurality of the air fan measurement devices has an electrical wire for power supply and data communication. The electrical wires extend from the plurality of the air fan measurement devices to a remote air fan measurement interface. To prevent tangling, mechanical damage and electrical fault to the electrical wires included in the air fan measurement tool 100, the wire management ring 110 is utilized to group and secure the electrical wires within a region of the air fan measurement tool 100. Specifically, the electrical wires are configured to pass through the wire management ring 110 and are aligned along a major length of the boom 112.

In an example embodiment, the air fan measurement tool 100 also includes a mechanical support 116 that is configured to provide mechanical support to the boom 112. In particular, a first end of the boom 112 engages the mechanical support 116 to make the boom 112 stable at a position above the air fan 102. More specifically, a relative position of the boom 112 to the air fan 102, e.g., a vertical tilting angle of the boom 112, can be adjusted by securing the mechanical support 116, including a vertical support, an angular support, and a horizontal support included therein. In this example, the mechanical support 116 is disposed adjacent to the air fan guard 124 when a base 114 of the air fan measurement tool 100 is attached to the air fan guard 124. The wire management ring 110 is configured to secure the wires of the air fan measurement devices while adjusting the tilting angle of the boom 112.

In an example embodiment, the air fan measurement tool 100 includes a base 114 that attaches the air fan measurement tool 100 to the air fan 102. As shown in FIG. 1, the base 114 is attached to the air fan guard 124 and provides mechanical support to the mechanical support 116 through an engagement therebetween. In this example, the base 114 contains a magnet that attaches the base 114 on the air fan guard 124 through magnetic force generated by the magnet. In this example, the magnet of the base 114 can be manually switched on or off. An operator can manually switch the magnet of the base 114 to adjust the location of the air fan measurement tool 100 relatively to the air fan 102.

In an example embodiment, the air fan measurement tool 100 consists of the plurality of air fan measurement devices, each of the air fan measurement devices embedding an anemometer and a thermometer for the air flow measurement and air temperature measurement, respectively. In this example and as shown in FIG. 1, the air fan measurement tool 100 includes 5 air fan measurement devices that are located on the boom 112. These air fan measurement devices are distributed along the air fan radius from the center to the edge of the air fan, measuring air flow and air temperature at various air fan radial distances. Each of the air fan measurement devices may be connected to the air fan measurement interface device through an electrical wire to transfer and store measurement data to the air fan measurement interface device. The electrical wires may be grouped and aligned along the major length of the boom 112 by passing them through one or more wire management rings that are disposed on the boom 112. In an example embodiment, the air fan measurement tool 100 is configured to measure air flow and air temperature at multiple, e.g., 5 or more, locations per air fan quadrant, according to industry standards.

Figure 2:
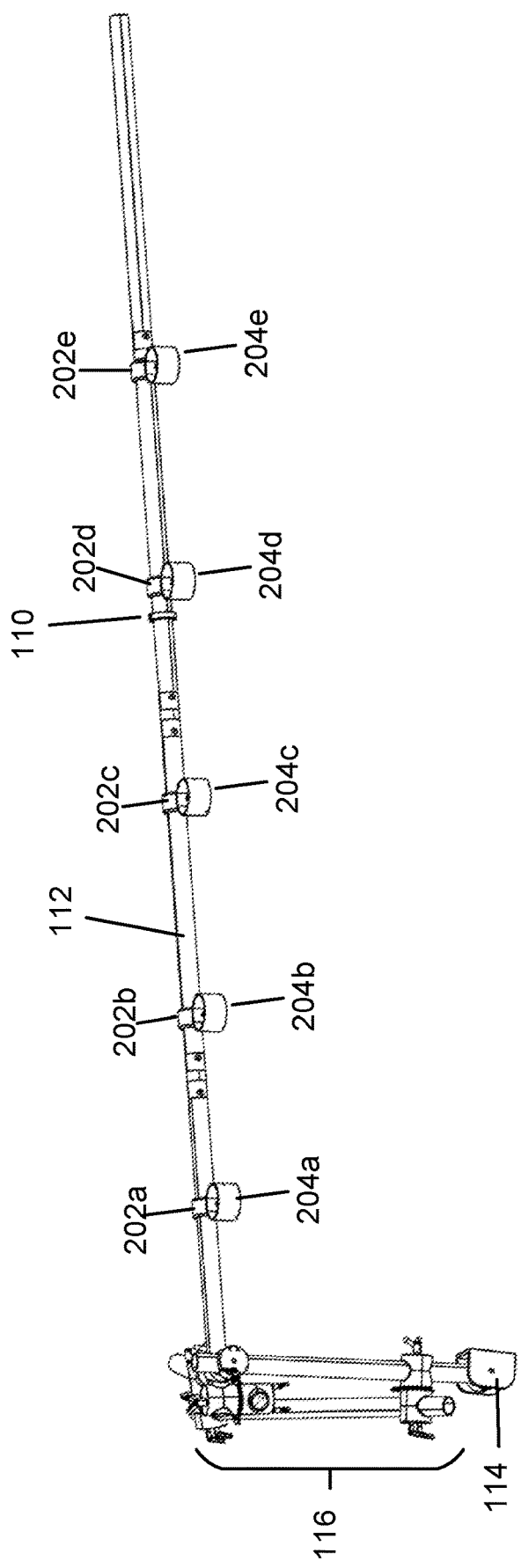
FIG. 2 is a perspective view of the wire management ring disposed on the air fan measurement tool according to the example embodiment.

FIG. 2 is a perspective view of the air fan measurement tool 100 and with a wire measurement ring 110 disposed there on, according to the example embodiment. To minimize redundancy, not all features of the air fan measurement tool 100 discussed with respect to FIG. 1 are repeated below. As described earlier, the air fan measurement tool 100 includes the base 114, the mechanical support 116, and the boom 112. FIG. 2 illustrates detailed configurations and components included in the base 120 and the boom 112.

In an example embodiment, the mechanical support 116 engages the base 114. In addition, the boom 112 is assembled by a plurality of segments each connected to adjacent neighboring segments. Specifically, as shown in FIG. 2, the boom 112 consists of four segments along its major length. In an example embodiment, the air fan measurement tool 100 includes the plurality of air fan measurement devices 204a, 204b, 204c, 204d, and 204e. These air fan measurement devices are attached on the boom 112 by mounting clamps 202a, 202b, 202c, 202d, and 202e, respectively. In this example, the air fan measurement devices 204a, 204b, 204c, 204d, and 204e are spaced equidistantly on the boom 112 by adjusting locations of the mounting clamps 202a 202b, 202c, 202d, and 202e accordingly. Further, each of the air fan measurement devices 204 can be tilted independently to align with the air flow and the air fan plane. In this example, each of the plurality of air fan measurement devices 204 has an electrical wire that extends to the remote air fan measurement interface device along the boom 112. In particular, each of the electrical wires passes through at least one wire management ring that is disposed on the boom 112. For example, the wire management ring 110, as shown in FIG. 2 is disposed between the air fan measurement devices 204d and 204c. A first electrical wire of the air fan measurement device 204e and a second electrical wire of the air fan measurement devices 204d pass through the wire management ring 110 and are secured therein.

In an example embodiment, there are multiple wire management rings disposed on the boom 112 of the air fan measurement tool 100. For example, there may be a second wire management ring (not shown in FIG. 2), similar to the wire management ring 110, that is disposed on the boom 112 between the air fan measurement devices 202b and 202c. In this example, the first electrical wire of air fan measurement device 204e and a second electrical wire of air fan measurement device 204d pass through both of the wire management ring 110 and the second wire management ring. Further, a third electric wire extends from the air fan measurement device 204c and passes through the second wire management ring. Here, the second wire management ring groups a total of three electric wires extending from air fan measurement devices 204c, 204d, and 204e to the remote air fan measurement interface device. The above noted wire management rings secure the electric wires from tangling and from hanging downward into the air fan 102 to avoid electrical fault and safety issues.

In an example embodiment, there may be a final wire management ring (not shown), similar to the wire management ring 110 and the second wire management ring, that is disposed at the first end of the boom 112 proximate to the mechanical support 116. This final wire management ring is configured to secure all the electrical wires of the air fan measurement devices 204 attached to the boom 112. That is, the electrical wires of air fan measurement devices 204a, 204b, 204c, 204d, and 204e all extend along the major length of the boom 112 and pass through the final wire management ring. In this example, all the electrical wires of the air fan measurement tool 100 are grouped and secured in the final wire management ring. In an example embodiment, there may be multiple wire management rings disposed between neighboring air fan management devices on the boom 112, especially for a configuration having a long distance between the neighboring air fan management devices.

Figure 3:
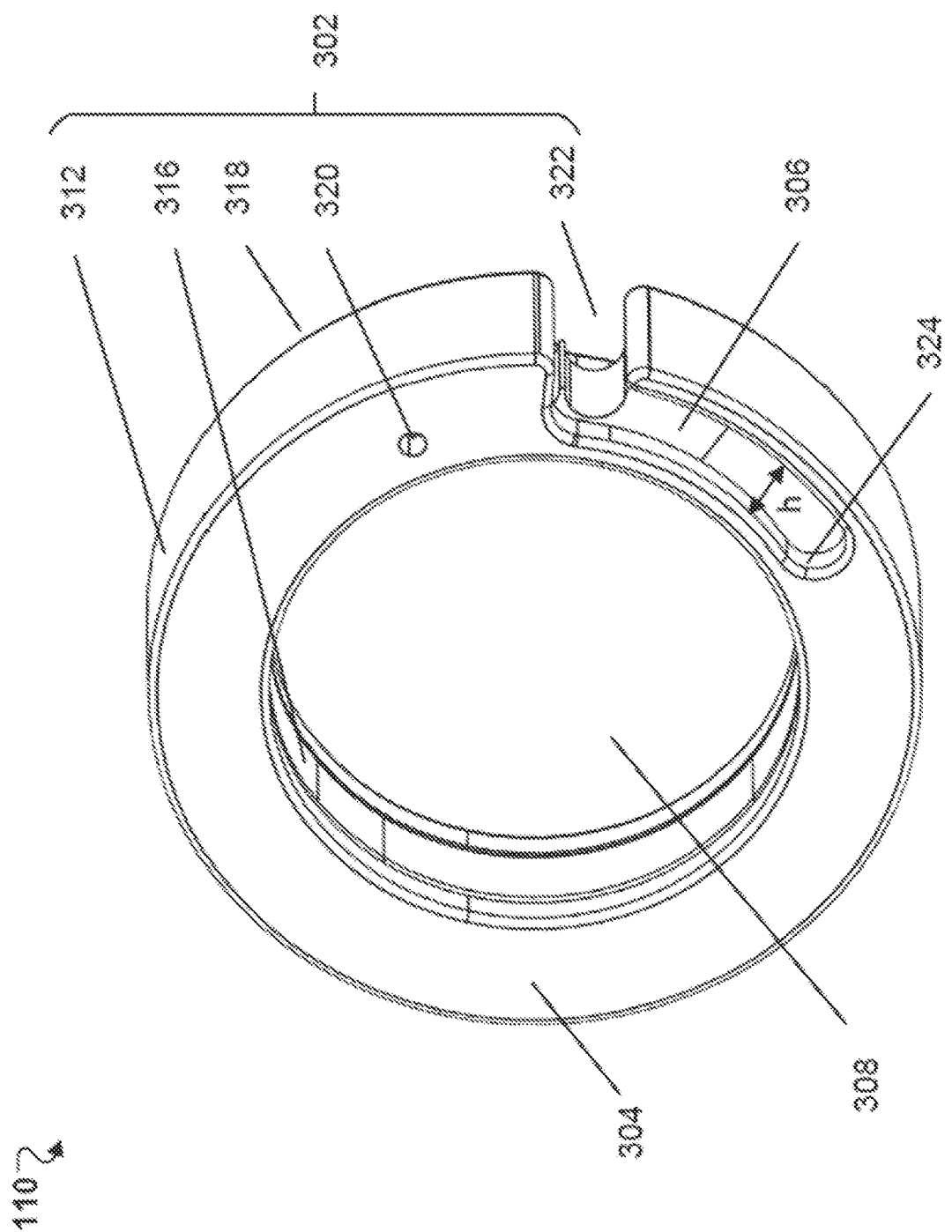
FIG. 3 is a perspective view of a wire management ring according to an example embodiment.

FIG. 3 shows a perspective view of the wire management ring 110 according to an example embodiment. The wire management ring 110 has an outer housing including an outer housing base 302 and a removable outer housing cover 304. The outer housing base 302 has a ring shape and the outer housing cover 304 is attached on the outer housing base 302 to form the outer housing. In addition, the wire management ring 110 includes an inner securing ring that is disposed within the outer housing.

In an example embodiment, the outer housing base 302 includes an inner ring surface 316 that defines an inner diameter of the wire management ring 110. The outer housing base 302 also includes an outer ring surface 312 that defines an outer diameter of the wire management ring 110. In addition, between the inner ring surface 316 and the outer ring surface 312, a back surface 318 (not visible in FIG. 3) of the outer housing base 302 exists and connects the inner ring surface 316 and the outer ring surface 312. The outer housing cover 304 also has a ring shape and connects the inner ring surface 316 and the outer ring surface 312 of the outer housing base 302. In this example, the wire management ring 110 further include a first hole 320 located on the outer housing cover 304.

In an example embodiment, the wire management ring 110 contains a wire clamping region 324 that extends along a circumference of the wire management ring 110. The clamping region 324 is located in the outer housing and is formed by open regions in the outer housing cover 304 and the back surface 318 of the outer housing base 302. In addition, the clamping region 324 consists of an opening 322 that is formed in the outer ring surface 312 of the outer housing base 302. Specifically, the opening 322 is located on a top portion of the clamping region 324 and is configured as an entrance through which a wire is inserted into or pulled out of the wire management ring 110. In this example, a width "h" of the clamping region 324 is less than a width of the outer housing cover 304.

In an example embodiment, the wire management ring 110 includes an inner securing ring that is disposed within a space encapsulated by the outer housing base 302 and the outer housing cover 304. When inserting and securing wires in the wire management ring 110, the inner securing ring 306 is configured to rotate in a clockwise direction (when viewed as shown in FIG. 3) along a circumference of the wire management ring 110 for wire management operations. In another example embodiment, the wire clamping region 324 may be disposed on a left hand side of the wire management ring 110. In the case of the left hand position, the opening 322 is still located at a top portion of the wire clamping region 324. However, the inner securing ring 306 is then rotated in a counter-clockwise direction (when viewed as shown in FIG. 3) when inserting and securing wires in the wire management ring 110 during the wire management operations.

In an example embodiment, the wire management ring 110 is disposed on a boom 112 of the air fan measurement device 100 to secure electrical wires for air fan performance measurement. As shown in FIG. 3, the wire management ring 110 has an inner space 308 that is defined by the inner surface 316 of the outer housing base 302. A diameter of the inner space 308 may be equal to or less than a diameter of the boom 112 so as to pass the boom 112 through the inner space 308 and dispose the wire management ring 110 thereon. In this example, the inner diameter of the wire management ring 110 may range from 1 inch to 3 inches.

Figure 4:
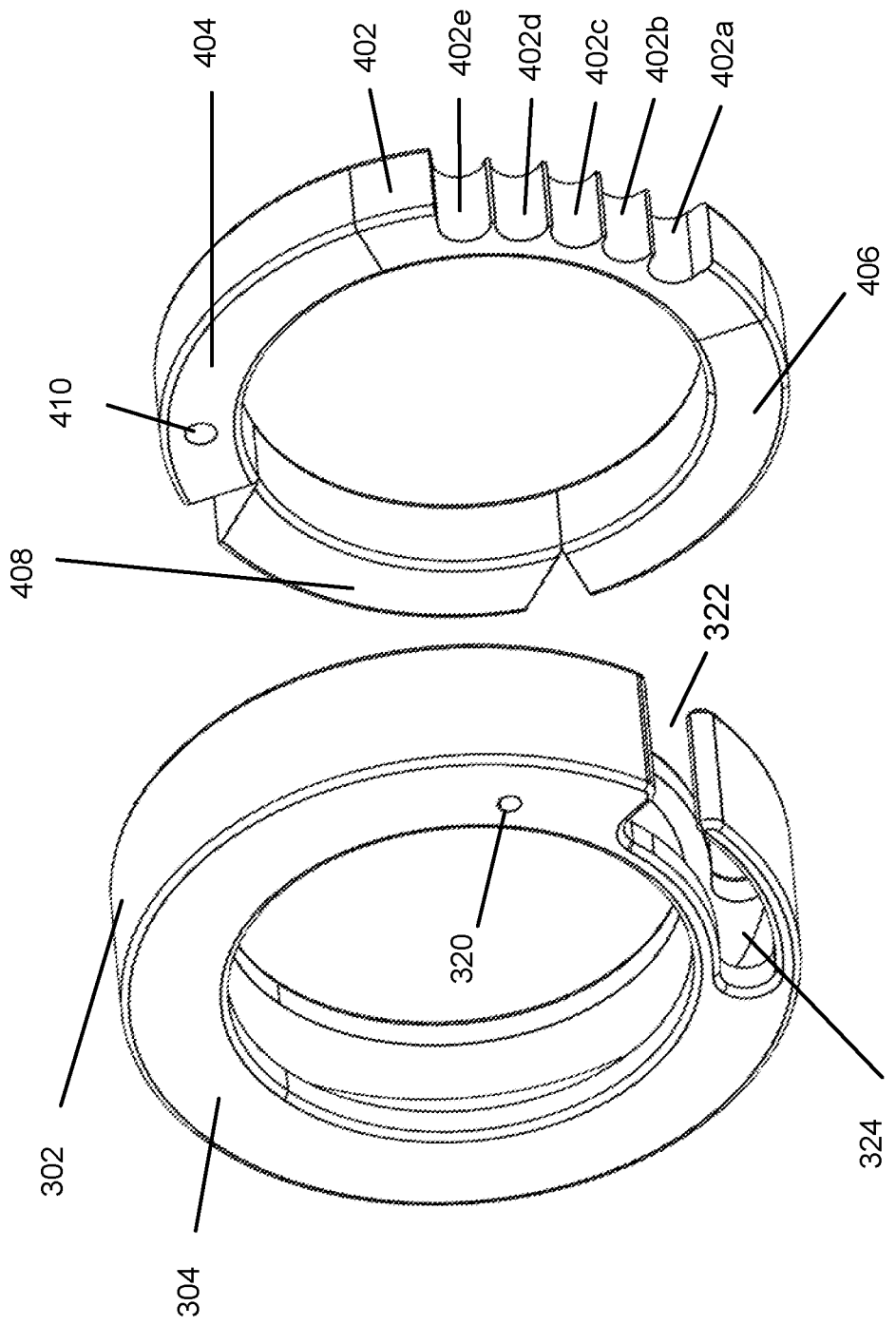
FIG. 4 is an exploded view of the wire management ring according to an example embodiment.

FIG. 4 is an exploded view of the wire management ring 110 according to an example embodiment. To minimize redundancy, not all features of the wire management ring 110 discussed with respect to FIGS. 1 to 3 are repeated below. As described earlier, the wire management ring 100 includes the outer housing consisting of the outer housing base 302 and the outer housing cover 304. The wire management ring 110 also includes the inner securing ring 306 disposed in the outer housing for wire management operations. FIG. 4 illustrates detailed configurations and components included in the inner securing ring 306.

In certain example embodiments, the inner securing ring 306 can be a single, continuous element. Alternatively, as illustrated in the example of FIG. 4, the inner securing ring can comprise multiple segments that form a ring. In the example embodiment of FIG. 4, the inner securing ring 306 includes a wire securing segment 402 that is configured to hold and secure wires in the wire clamping region 324. Specifically, the wire securing segment 402 consists of a plurality of notches that are aligned in parallel about a ring axis passing through the center of the inner space 308, such axis coinciding with or being parallel with the major length of the boom 112 on which the wire management ring 110 is placed. Each of the plurality of notches is facing toward the outer ring surface 312 of the outer housing base 302. In this example, the wire securing segment 402 includes five notches 402a, 402b, 402c, 402d, and 402e. All of the notches are aligned next to each other along a perimeter of the wire securing segment 402. In addition, each of the notches has a semi-circular shape with a diameter equal to or smaller than the width h of the wire clamping region 324. With this configuration, the wire management ring 110 utilizes the notches of the wire securing segment 402 to secure wires. As a result, each of the wires secured by the notches has a diameter larger than a radius of the notches. Further, the diameter of each of the wires is equal to or smaller than the diameter of the notches, to make sure the wires are securely disposed in the notches respectively. In this example, the diameter of the plurality of notches may range from 0.1 inch to 0.5 inch. Moreover, a total length of the plurality of notches along the circumference of the wire securing segment 402 is shorter than a length of the wire clamping region 324.

In an example embodiment, the inner securing ring 306 further includes a first ring segment 404 that is connected to a first end of the wire securing segment 402 and that is disposed in the outer housing. In addition, the inner securing ring 306 includes a second ring segment 406 that is connected to a second end of the wire securing segment 402 and that is also disposed in the outer housing. Moreover, the inner securing ring 306 includes a third ring segment 408 that is located between the first ring segment 404 and the second ring segment 406 within the outer housing. As shown in FIG. 4, the third ring segment 408 is connected to both of the first ring segment 404 and the second ring segment 406. The wire securing segment 402, the first ring segment 404, second ring segment 406, and the third ring segment 408 can be joined as shown in FIG. 4 to form the inner securing ring 306.

In an example embodiment, the opening 322 fully exposes only one of the plurality of notches when the wire management ring 110 is configured to secure a wire. For example, as discussed previously in connection with FIG. 2, the wire management ring 110 is configured to secure a first electrical wire connected to the air fan measurement device 204e and a second electrical wire connected to the air fan measurement device 204d. Securing wires with the wire management ring 110 begins by rotating the inner securing ring 306 in the outer housing. In particular, the wire securing segment 402 is rotated to align the first notch 402a with the opening 322. Here, the notch 402a is fully exposed through the opening 322, therefore the first electrical wire can be inserted in the notch 402 through the opening 322. Next, the wire securing segment 402 is continually rotated clockwise until an adjacent notch 402b is fully exposed at the opening 322. This rotation also moves the first notch 402a as well as the first electrical wire along the length of the wire clamping region 324. Here, the first electrical wire is secured in the wire clamping region 324, surrounded by the notch 402a and the outer ring surface 312. The fully exposed second notch 402b enables inserting the second electrical wire therein, which is followed by a continuous rotation of the wire securing segment 402 in the clockwise direction. Similarly, the second electrical wire is secured within the wire clamping region 324, surrounded by the notch 402b and the outer ring surface 312. The rotation of the wire securing segment 402 stops at a location where the third notch 402c is fully exposed at the opening 322, making the wire management ring 110 ready for securing the next wire.

In an example embodiment, the rotation of the wire securing segment 402 involves a rotation of the first ring segment 404, the second ring segment 406, and the third ring segment 408 in a same direction within the outer housing. In an example embodiment, the inner securing ring 306 includes a second hole 410 that is located on the first ring segment 404, and an adjustable handle. The adjustable handle can be inserted into the first hole 320 to make contact with the inner securing ring 306. The inner securing ring 306 can be locked in the outer housing by fastening the adjustable handle through the first hole 320. For example, when the inner securing ring 306 is rotated to fully expose the first notch 402a at the opening 322, the adjustable handle can be fastened through the first hole 320 to lock the inner securing ring 306 and prepare the wire management ring 110 for inserting the first electrical wire. In another example, when the first electrical wire is secured in the wire clamping region 324 and the second notch 402b is fully exposed at the opening 322, the adjustable handle can be fastened through the first hole 320 to lock the inner securing ring 306, preparing the wire management ring 110 for inserting the second electrical wire.

In another example embodiment, the wire management ring 110 is locked by aligning the first hole 320 and the second hold 410, and fastening the adjustable handle through the first hole 320 and the second hole 410 to restrict movement of the inner securing ring 306 in the outer housing. For example, when the wire management ring 110 is disposed at the first end of the boom 112 and all the electrical wires of the air fan measurement tool 100 have been inserted into the wire management ring 110, the electrical wires of the air fan measurement devices are each secured in the notches 402a, 402b, 402c, 402d, and 402e, respectively. Those notches, as well as the electrical wires, are rotated away from the opening 322 and are disposed securely in the wire clamping region 324. At this point, the inner securing ring 306 is further rotated to align its second hole 410 to the first hole 320. The adjustable handle is then inserted and fastened in through the first hole 320 and the second hole 410 to lock the wire management ring 110.

In an example embodiment, the outer housing, the inner securing ring 306, the wire securing segment 402, the first ring segment 404, the second ring segment 406, and the third ring segment 408 are made of materials with similar thermal expansion coefficients.

Figure 5:
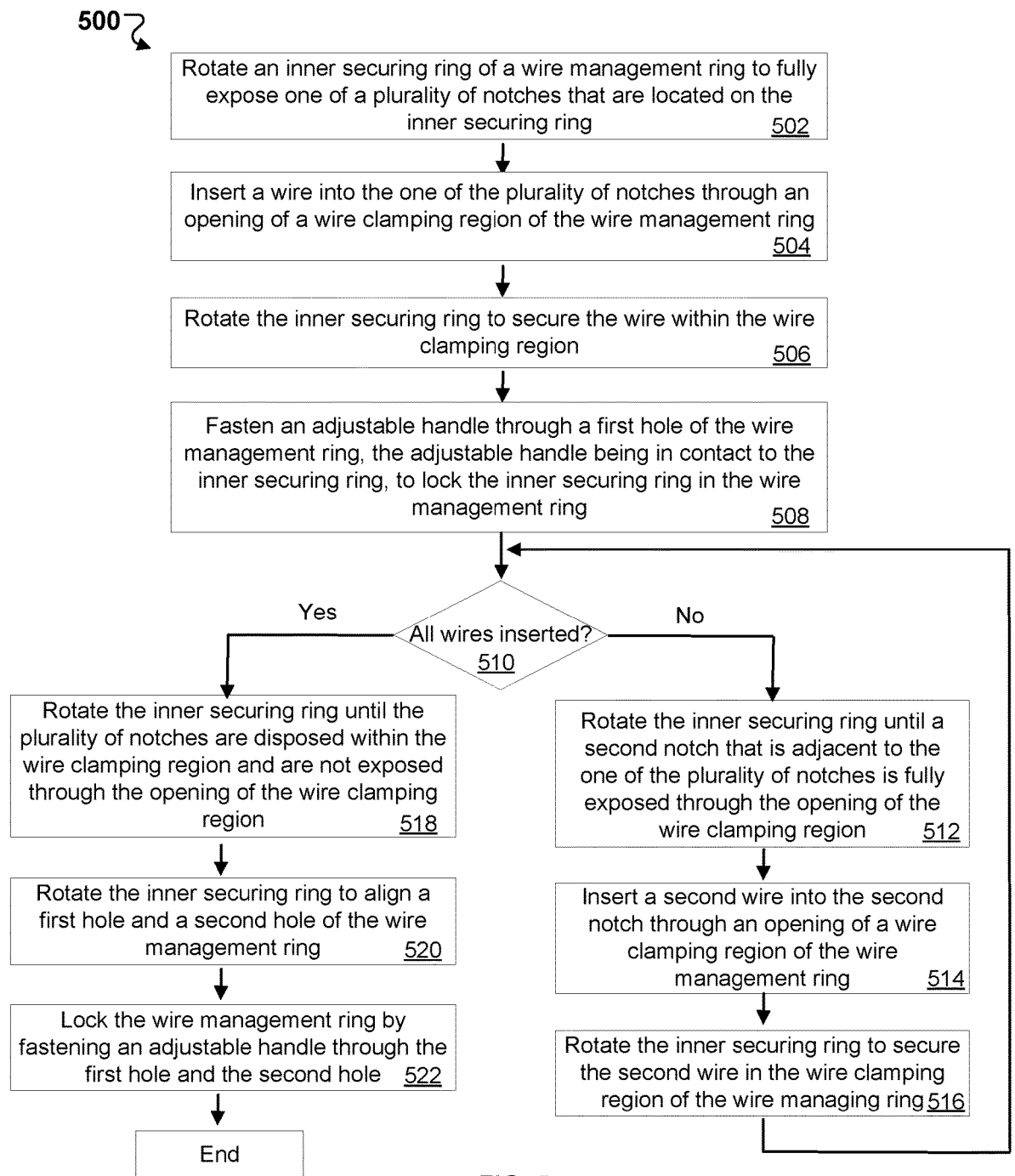
FIG. 5 illustrates a method for securing wires by the wire management ring according to an example embodiment.

FIG. 5 illustrates a method for grouping and securing electrical wires by the wire management ring according to an example embodiment. Referring to FIGS. 1-5, in an example embodiment, the method 500 includes rotating an inner securing ring of a wire management ring to fully expose one of a plurality of notches that are located on the inner securing ring, at 502. For example, the wire securing segment 402 is rotated in a clockwise direction to fully expose notch 402a at the opening 322. The method 500 further includes inserting a wire into the one of the plurality of notches through an opening of a wire clamping region of the wire management ring, at 504. For example, the first electrical wire of the air fan measurement device 204e is inserted into the notch 402a through the opening 322 of the wire management ring 110. In addition, the method 500 includes rotating the inner securing ring to secure the wire within the wire clamping region, at 506. For example, the wire securing segment 402 can continue to be rotated in the clockwise direction while having the first electrical wire inserted in the notch 402a. This way, the notch 402a and the first electrical wire are both rotated into the wire clamping region 324.

Specifically, the first wire passes through the wire clamping region 324 and is secured between the notch 402a and the outer ring surface 312. Moreover, the method 500 includes fastening an adjustable handle through a first hole of the wire management ring, the adjustable handle being in contact with the inner securing ring, to lock the inner securing ring in the wire management ring, at 508. For example, once the first wire passes through the wire clamping region 324 and is secured therein, the adjustable handle is inserted into the first hole 320 and makes contact with the inner securing ring 316. The adjustable handle is further fastened to lock the inner securing ring 316 in the outer housing.

Next, the method 500 determines if all the wires have been inserted into the wire management ring, at 510. For example, the operator performing the air fan measurements may decide that there are additional wires to insert into the wire management ring 110, e.g., the second electrical wire connected to the air fan measurement device 204d. Therefore, not all the wires have been inserted into the wire management ring 110.

When it is determined that not all the wires have been inserted in the wire management ring, the method 500 includes rotating the inner securing ring until a second notch is fully exposed through the opening of the wire clamping region, at 512. For example, based on a determination that a second electrical wire should be inserted into the wire management ring 110, the wire securing segment 402 is continuously rotated in the clockwise direction to fully expose the notch 402b at the opening 322. In addition, the method 500 includes inserting a second wire into the second notch through an opening of a wire clamping region of the wire management ring and rotating the inner securing ring to secure the second wire in the wire clamping region of the wire management ring, at 514 and 516. Here, the second electrical wire is inserted into the notch 402b through the opening 322, and is rotated in the clockwise direction into the wire clamping region 324. Similarly, the second electrical wire passes through the wire clamping region 324 and is secured therein by the surrounding notch 402b and the outer ring surface 312.

If it is determined that all the wires have been inserted into the wire management ring, then the method 500 includes rotating the inner securing ring until the plurality of notches are disposed within the wire clamping region and are not exposed through the opening of the wire clamping region, at 518. For example, the final wire management ring discussed previously, is disposed at the first end of the boom 112 and is configured to have all the electrical wires connected to the air fan measurement devices 204 secured therein. Once all the electrical wires are secured in the final wire management ring 110, the operator decides that all the wires have been inserted and secured in the wire management ring 110. Next, the method 500 includes rotating the inner securing ring to align a first hole and a second hole of the wire management ring, at 520. For example, the inner securing ring 306 of the final management ring is continuously rotated in the clockwise direction to have the first hole 320 and the second hole 410 aligned. Lastly, the method 500 includes locking the wire management ring by fastening an adjustable handle through the first hole and the second hole, at 522. For example, once the first hole 320 and the second hole 410 are aligned, the adjustable handle is inserted into the first hole 320 and the second hole 410. The adjustable handle is further fastened to lock the wire management ring 110.

For any figure shown and described herein, one or more of the components or steps may be omitted, added, repeated, and/or substituted. Accordingly, embodiments shown in a particular figure should not be considered limited to the specific arrangements of components shown in such figure.

Further, if a component of a figure is described but not expressly shown or labeled in that figure, the label used for a corresponding component in another figure can be inferred to that component. Conversely, if a component in a figure is labeled but not described, the description for such component can be substantially the same as the description for the corresponding component in another figure.

Referring generally to the examples herein, any components of the tool, described herein can be made from a single piece (e.g., as from a mold, injection mold, die cast, 3-D printing process, extrusion process, stamping process, or other prototype methods). In addition, or in the alternative, a component of the tool can be made from multiple pieces that are mechanically coupled to each other. In such a case, the multiple pieces can be mechanically coupled to each other using one or more of a number of coupling methods, including but not limited to epoxy, welding, fastening devices, compression fittings, mating threads, and slotted fittings. One or more pieces that are mechanically coupled to each other can be coupled to each other in one or more of a number of ways, including but not limited to fixedly, hingedly, removeably, slidably, and threadably.

Terms such as "first", "second", "top", "bottom", "side", "inner", "outer", and "within" are used merely to distinguish one component (or part of a component or state of a component) from another. Such terms are not meant to denote a preference or a particular orientation, and are not meant to limit the embodiments described herein. In the example embodiments described herein, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Although particular embodiments have been described herein in detail, the descriptions are by way of example. The features of the embodiments described herein are representative and, in alternative embodiments, certain features, elements, and/or steps may be added or omitted. Additionally, modifications to aspects of the embodiments described herein may be made by those skilled in the art without departing from the spirit and scope of the following claims, the scope of which are to be accorded the broadest interpretation so as to encompass modifications and equivalent structures.

What is claimed is:

1. A wire management ring, comprising:
    an outer housing, comprising:
        an outer housing base in a ring shape and having a back surface located between an inner ring surface and an outer ring surface, the outer housing including a wire clamping region that is disposed along a circumference of the outer housing, and
        an outer housing cover that is attached to the outer housing base, and
        an opening of the wire clamping region disposed on the outer ring surface, on an edge of the back surface, and an edge of the outer housing cover; and
    an inner securing ring that is disposed within the outer housing base, the inner securing ring including a plurality of notches that are configured to secure, respectively, a plurality of wires passing through the wire management ring.

2. The wire management ring of claim 1, wherein the plurality of wires are locked into or removed from the wire clamping region through the opening of the wire clamping region.

3. The wire management ring of claim 2, wherein the inner securing ring comprises:
- a wire securing segment that includes the plurality of notches,
- a first ring segment that is connected to a first end of the inner securing ring and that is disposed within the outer housing base,
- a second ring segment that is connected to a second end of the inner securing ring and that is disposed within the outer housing base, and
- a third ring segment that is connected to the first ring segment and the second ring segment and that is disposed within the outer housing base.

4. The wire management ring of claim 3, wherein the outer housing, the inner securing ring, the first ring segment, the second ring segment, and the third ring segment are made by materials with similar thermal expansion coefficients.

5. The wire management ring of claim 2, wherein each of the plurality of wires is secured in the wire clamping region of the wire management ring by each of the plurality of notches of the inner securing ring and the outer ring surface of the outer housing base.

6. The wire management ring of claim 2, wherein the inner securing ring is rotated, based on one of the plurality of wires being locked into one of the plurality of notches through the opening of the wire clamping region, within the outer housing.

7. The wire management ring of claim 6, wherein the inner securing ring rotates until a notch that is adjacent to the one of the plurality of notches is fully exposed through the opening of the wire clamping region.

8. The wire management ring of claim 6, wherein the opening fully exposes only one notch of the plurality of notches at a time as the inner securing ring rotates within the outer housing.

9. The wire management ring of claim 6, wherein the inner securing ring rotates until the plurality of notches are disposed within the wire clamping region and are not exposed through the opening of the wire clamping region.

10. The wire management ring of claim 1, wherein each of the plurality of notches has a semi-circular shape, and wherein a diameter of each of the plurality of notches is equal to or smaller than a width of the wire clamping region.

11. The wire management ring of claim 1, wherein a diameter of each of the plurality of wires is larger than a radius of each of the plurality of notches, and wherein the diameter of each of the plurality of wires is equal to or smaller than a diameter of each of the plurality of notches.

12. The wire management ring of claim 1,
- wherein the wire management ring is disposed on a boom, the boom passing through an inner diameter of the wire management ring,
- wherein a diameter of the boom is equal to or smaller than the inner diameter of the wire management ring, and
- wherein the plurality of electrical wires are disposed along a longitude axis of the boom.

13. The wire management ring of claim 12,
- wherein a diameter of each of the plurality of notches ranges from 0.1 inch to 0.5 inch, and
- wherein the inner diameter of the wire management ring ranges from 1 inch to 3 inches.

14. A wire management ring, comprising:
- an outer housing, comprising:
  - an outer housing base in a ring shape, the outer housing including a wire clamping region that is disposed along a circumference of the outer housing, and
  - an outer housing cover that is attached to the outer housing base, wherein a first hole is located on the outer housing cover; and
- an inner securing ring that is disposed within the outer housing base, the inner securing ring including a plurality of notches that are configured to secure, respectively, a plurality of wires passing through the wire management ring, wherein a second hole is located on the inner securing ring; and
- an adjustable handle that is configured to be inserted into the first hole and that is in contact with the inner securing ring.

15. The wire management ring of claim 14,
- wherein the inner securing ring is locked within the outer housing by fastening the adjustable handle through the first hole, and
- wherein the wire management ring is locked by rotating the inner securing ring within the outer housing to align the first hole and the second hole, and fastening the adjustable handle through the first hole and the second hole.

16. A method of managing wire, comprising:
- rotating an inner securing ring of a wire management ring to fully expose one of a plurality of notches that are located on the inner securing ring;
- inserting a wire into the one of the plurality of notches through an opening of a wire clamping region of the wire management ring;
- rotating the inner securing ring to secure the wire within the wire clamping region; and
- fastening an adjustable handle through a first hole of the wire management ring, the adjustable handle being in contact with the inner securing ring, to lock the inner securing ring in the wire management ring.

17. The method of claim 16, further comprising:
- rotating the inner securing ring until a second notch that is adjacent to the one of the plurality of notches is fully exposed through the opening of the wire clamping region;
- inserting a second wire into the second notch through an opening of a wire clamping region of the wire management ring; and
- rotating the inner securing ring to secure the second wire in the wire clamping region of the wire managing ring.

18. The method of claim 16, wherein the wire management ring comprises:
- an outer housing, comprising:
  - an outer housing base in a ring shape, the outer housing including the wire clamping region that is disposed along a circumference of the outer housing, and
  - an outer housing cover that is attached to the outer housing base, and the inner securing ring, comprising:
  - a wire securing segment that is disposed within the outer housing base, the wire securing segment including the plurality of notches that are configured to secure a plurality of wires passing through the wire management ring, respectively,
  - a first ring segment that is connected to a first end of the wire securing segment and that is disposed within the outer housing base, a second ring segment that is connected to a second end of the wire securing segment and that is disposed within the outer housing base, and a third ring segment that is connected to the first ring segment and the second ring segment and that is disposed within the outer housing base.

19. The method of claim 18, wherein the outer housing base comprises:

an inner ring surface that defines an inner diameter of the wire management ring, an outer ring surface that defines an outer diameter of the wire management ring, and a back surface that is located between the inner ring surface and the outer ring surface, and wherein the opening of the wire clamping region is disposed on the outer ring surface, on an edge of the back surface, and on an edge of the outer housing cover.

* * * * *